United States Patent [19]

Boardman et al.

[11] 3,907,564

[45] Sept. 23, 1975

[54] PREPARING LITHOGRAPHIC PLATES UTILIZING HYDROLYZABLE MERCAPTO-SILANE COMPOUNDS

[75] Inventors: Harold Boardman, Chadds Ford, Pa.; Richard L. Wagner, Wilmington, Del.

[73] Assignee: Hercules Incorporated, Wilmington, Del.

[22] Filed: June 27, 1974

[21] Appl. No.: 483,845

[52] U.S. Cl. .................................. 96/33; 96/115 P
[51] Int. Cl.[2] .......................................... G03F 7/02
[58] Field of Search ............................ 96/33, 115 P

[56] References Cited

UNITED STATES PATENTS

| | | | |
|---|---|---|---|
| 3,163,534 | 12/1964 | Adams et al. | 96/33 |
| 3,606,922 | 9/1971 | Doggett | 96/33 |
| 3,615,538 | 10/1971 | Peters et al. | 96/33 |
| 3,782,940 | 1/1974 | Ohto et al. | 96/115 P |

*Primary Examiner*—Norman G. Torchin
*Assistant Examiner*—Judson R. Hightower
*Attorney, Agent, or Firm*—Marion C. Staves

[57] ABSTRACT

It has been found that lithographic printing plates can be prepared by (a) photografting to an unsaturated oleophilic organic polymer substrate a potentially hydrophilic hydrolyzable mercapto-silane compound having the general formula $$\begin{array}{c} (T)_b \\ | \\ (X)_a\text{—Si—}(R\text{—}SH)_c \end{array}$$

where R is an organic radical, X is selected from mono and dialkylamino, alkyl and aryl amido, alkoxy, aryloxy and alkyl and aryl oxycarbonyl radicals; T is selected from alkyl, cycloalkyl, aryl, alkaryl and aralkyl radicals, and the corresponding halogenated radicals; *a* is an integer from 1 to 3; *b* is an integer from 0 to 2; *c* is an integer from 1 to 3; and $a+b+c$ equals 4; (b) washing away non-photografted mercapto-silane compound; and (c) amplifying the hydrophilicity of the hydrolyzable silane groups by treating with a soluble silicate solution or a colloidal silica dispersion.

7 Claims, No Drawings

PREPARING LITHOGRAPHIC PLATES UTILIZING HYDROLYZABLE MERCAPTO-SILANE COMPOUNDS

This invention relates to a novel method for preparing lithographic printing plates. More particularly, this invention relates to a method for preparing lithographic printing plates by imagewise photochemically grafting a mercapto-silane compound to an oleophilic organic polymer substrate, washing away non-grafted compound, and then amplifying the hydrophilicity of the hydrolyzable or hydrolyzed silane groups.

It is known to modify the surface of various hydrophilic substrates by photocrosslinking imagewise a thin layer of resin coated on the substrate. After washing away the uncrosslinked resin, the resulting plate consists of oleophilic crosslinked resin printing areas, and hydrophilic substrate non-printing areas.

It has now been found that lithographic printing plates of excellent quality can be prepared by (1) photografting image-wise to an unsaturated oleophilic organic polymer substrate a potentially hydrophilic hydrolyzable mercapto-silane compound, (2) washing away non-grafted mercapto-silane compound, and (3) amplifying the hydrophilicity of the hydrolyzable silane groups by treating with a soluble silicate solution or a colloidal silica dispersion. By "photografting" is meant the direct photoinitiated chemical coupling reaction of a mercapto-silane compound with an organic polymer. By "amplifying the hydrophilicity" is meant reacting the grafted hydrolyzable or hydrolyzed silane groups with soluble silicates or colloidal silica thus greatly increasing the hydrophilic character of the grafted sites.

Any unsaturated organic polymer can be used as the substrate in accordance with this invention, provided it is oleophilic, wettable by organic solvent-based inks, but is insoluble in and substantially unswollen by such inks. Most amorphous polymers with a second order transition temperature below about 50°C. must be crosslinked to some degree to provide such solvent resistance. Typical applicable polymers are unsaturated hydrocarbon polymers including trans-1,4-polybutadiene, trans-1,4-polyisoprene, cyclized natural rubber, unsaturated rubbers such as buty rubber, natural rubber, styrene-butadiene rubber, cis-1,4-polyisoprene, 1,2-polybutadiene, and ethylene-propylene-dicyclopentadiene terpolymer, and blends of these polymers with each other or non-hydrocarbon polymers.

In addition to the hydrocarbon polymers, a large number of other unsaturated polymers and modified unsaturated polymers, including copolymers, terpolymers, etc., may be used. Typical of these other polymers are unsaturated cellulose derivatives such as allyl ether modified cellulose acetate and ethyl cellulose; drying alkyd resins; allyl pentaerythritol derivatives such as esters of triallyl pentaerythritol and drying oil fatty acids; butadiene-acrylonitrile copolymers; linear and crosslinked unsaturated polyesters; copolymers of epichlorohydrin with unsaturated epoxides or oxetanes such as allylglycidyl ether; etc.

If desirable, the organic polymer substrate may have some sort of semi-rigid backing such as a metal, cardboard, or another polymer backing.

The silane compounds to be photografted to the olefin organic polymer substrate will in general have the formula $$(X)_a-\overset{(T)_b}{\overset{|}{Si}}-(R-SH)_c$$

where R is an organic radical, X is selected from mono and dialkyl amino, alkyl and aryl amido, alkoxy, aryloxy and alkyl and aryl oxycarbonyl radicals; T is selected from alkyl, cycloalkyl, aryl, alkaryl and aralkyl radicals and the corresponding halogenated radicals; where, most preferably, the alkyl groups will contain 1 to 18 carbon atoms, the cycloalkyl groups will contain 5 to 8 carbon atoms, and the aryl groups will contain 1 to 2 rings; *a* is an integer from 1 to 3; *b* is an integer from 0 to 2; *c* is an integer from 1 to 3; and $a+b+c$ equals 4. Most preferably, R will be an organic radical selected from the group consisting of alkylene, cycloalkylene, arylene, alkarylene, aralkylene, alkyl diarylene, aryl dialkylene, alkyl dicycloalkylene, cycloalkyl dialkylene, alkylene-oxy-alkylene, arylene-oxy-arylene, alkarylene-oxy-arylene, alkarylene-oxy-alkarylene, aralkylene-oxy-alkylene, and aralkylene-oxy-aralkylene; as well as the corresponding halogenated radicals; where the alkyl and alkylene groups will contain 1 to 18 carbon atoms, the cycloalkyl and cycloalkylene groups will contain 5 to 8 carbon atoms, and the aryl and arylene groups will contain 1 to 2 rings. Typical mercapto-silane compounds are

| | |
|---|---|
| $HS-(CH_2)_3-Si(OCH_3)_3$ | δ-mercaptopropyl trimethoxysilane |
| $HS-(CH_2)_3-Si[O(CH_2)_3CH_3]_3$ | δ-mercaptopropyl tributoxysilane |
| $HS-(CH_2)_3-Si[O(CH_2)_3CH_2Cl]_3$ | δ-mercaptopropyl trichlorobutoxysilane |
| $HS-(CH_2)_3-Si[O(CH_2)_{17}CH_3]_3$ | δ-mercaptopropyl trioctadecoxysilane |
| $HS-(CH_2)_3-Si[O(CH_2)_6CH_3]_3$ | δ-mercaptopropyl triheptoxysilane |

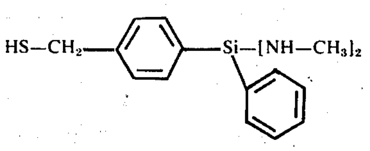

α-mercaptotolyl dimethylaminophenylsilane

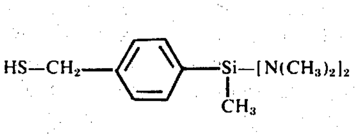

α-mercaptotolyl bis(dimethyl aminomethylsilane

–Continued

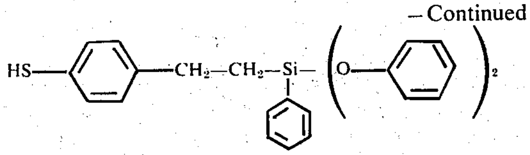
β-(p-mercaptophenyl)ethyl diphenoxyphenylsilane

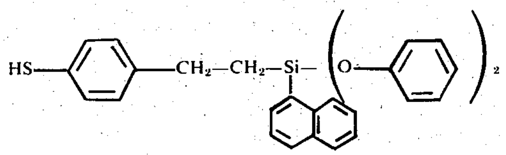
β-(p-mercaptophenyl)ethyl diphenoxynaphthylsilane

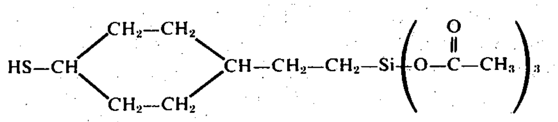
β-(4-mercaptocyclohexyl)-ethyl triacetoxysilane

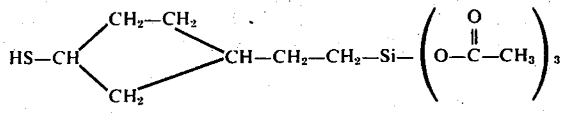
β-(3-mercaptocyclopentyl)-ethyl triacetoxysilane

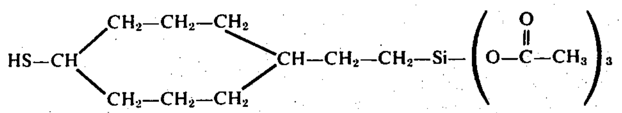
β-(5-mercaptocyclo-octyl)ethyl trimethoxy-silane $HS—(CH_2)_2—O(CH_2)_2—Si(OCH_2CH_3)_3$ β-mercaptoethoxyethyltri-ethoxysilane

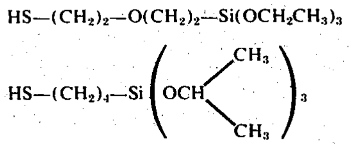
4-mercaptobutyltriisopropoxy-silane

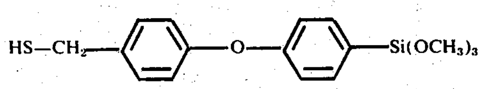
4-mercaptomethyl-4'-trimethoxy-silane diphenyl ether

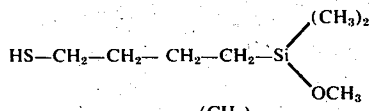
δ-mercaptobutyldimethyl-methoxysilane

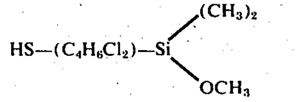
δ-mercaptodichlorobutyldimethyl-methoxysilane

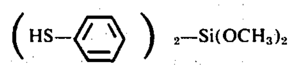
bis(p-mercaptophenyl)dimethoxysilane

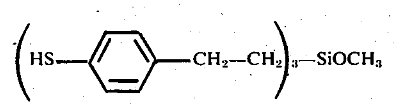
tris(p-mercaptophenylethyl)-methoxysilane

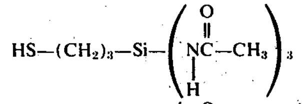
tris(acetamido)-γ-mercaptopropyl-silane

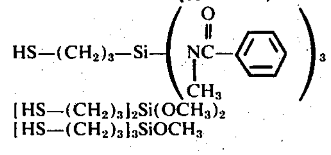
tris(N-methylbenzamido-γ-mercapto-propylsilane $[HS—(CH_2)_3]_2Si(OCH_3)_2$ bis(γ-mercaptopropyl)dimethoxysilane $[HS—(CH_2)_3]_3SiOCH_3$ tris(γ-mercaptopropyl)methoxysilane These mercaptosilanes require the presence of a photo-initiator to initiate photografting to the organic polymer substrate on being subjected to light radiation. Any of the well known dyes which are capable of forming a stable system with the mercaptosilane and organic polymer in the absence of light but which initiate grafting when irradiated with light can be used as a photoinitiator. Typical of these dyes are thionine, eosin, phloxine, rose bengal, hematoporphyrin, erythrosine, acriflavine, fluorescein, methylene blue, riboflavin, proflavine, benzoin methyl ether, benzophenone, Michler's ketone, thioxanthone, and the like. The amount of photoinitiator will depend upon the specific photoinitiator being used. However, the amount will preferably be sufficient to absorb substantially all of the incident radiation at the wave length of the maximum absorption of the photoinitiator.

The oleophilic organic polymer substrate can be coated with the silane compound in a number of ways, as for example, by dipping, brushing, rolling, etc., a solution or dispersion of the compound on the substrate. Typical solvent for the silane compounds are methanol, methylene chloride, acetone, methyl ethyl ketone or combinations of such solvents with water. Since the silane groups are to be amplified, it is only necessary to coat with a very thin layer of silane compound. Most preferably, at least about $10^{-9}$ moles per $cm^2$ will be used.

The amount and type of light radiation required to initiate grafting will vary, depending upon the silane compound being grafted and the photoinitiator being used. In general, photografting can be completed in a few seconds to 15 minutes. Photografting of mercaptosilanes will preferably be carried out with, but is not limited to use of, visible light. The optimum period of time and optimum wave length range of radiation required to initiate photografting using any particular silane compound can readily be determined by one skilled in the art.

Non-grafted silane compound can be removed from unexposed areas by washing with a solvent with or without scrubbing or brushing. Suitable solvents for removing the unreacted silane compound depend on the nature of the compound, but typically would be the same type as used to apply the compound. If water is present during the washing stage, hydrolyzable groups of the reacted silane will be hydrolyzed at this stage.

As pointed out above, the hydrolyzable or hydrolyzed silane groups on the photografted silane compound are treated with a silicate solution or a colloidal silica suspension to amplify their hydrophilicity. Any water-soluble silicate including both alkali and quaternary ammonium salts, can be used, as well as any silica which can form a colloidal suspension. In some cases it may be desirable to use a mixture of silicate and colloidal silica. There is not a definite distinction between soluble silicates and colloidal silicas, the difference between the two classes being arbitrary. Soluble silicates range from the alkali metal orthosilicates ($2M_2O \cdot SiO_2$, M = alkali metal), sesquisilicates ($3M_2O \cdot 2SiO_2$), and metasilicates ($M_2O \cdot SiO_2$), through higher molecular weight polysilicates with high average $SiO_2/M_2O$ ratios. As the $SiO_2/M_2O$ ratio increases, aqueous solutions become more viscous. At still higher ratios, the silicates give the typical opalescence and bluish cast due to light scattering. The system can, at this point, be considered an aqueous colloidal dispersion of discrete particles of surface hydroxylated silica. The choice of alkali metal, pH, and concentration of added aluminum oxide or other chemical modifiers affects the $SiO_2/M_2O$ ratio at which a true colloid may be said to exist. When a colloid is formed, the $SiO_2/M_2O$ ratio is so high that the bulk of the amorphous masses which have formed is largely $SiO_2$. The surface of the particles are made up of $-SiOH$ and $-SiO^-M^+$ functionality. The positive ions are in solution. The charge layers at each particle surface repel one another, stabilizing the sol. Soluble and colloid silicates can also be prepared with other monovalent positive counter ions in addition to the alkali metals, for example, quaternary ammonium salts, such as tetraethanolammonium and tetraethylammonium silicates, and other ammonium derivatives. Typical alkali metal silicates are sodium silicate, potassium silicate, lithium silicate. Typical commercial colloidal silicas are Ludox HS-40, HS, LS, SM-30, TM, AS, and AM (E. I. duPont). These materials vary in colloidal particle size, pH, stabilizing ion, $SiO_2/M_2O$ ratio, etc.

The silicate or silica amplifying agents can be applied to the previously photografted surfaces by a number of methods. By one method the photografted polymer plate is merely soaked in a silicate solution or colloidal suspension of silica. Soaking for a period of from about 1 minute to as much as several hours at a temperature from room temperature to about 90°C. will generally be sufficient. Other methods by applying the silicate or silica amplifying agents are by wiping, brushing or pouring the solution or suspension onto the plate surface. The amount of amplifying agent applied will be sufficient to react with all the silane groups photografted on the polymer substrate. In general, solutions of silicates or suspensions of colloidal silica will contain from about 1% to about 40%, by weight of amplifier.

Periodic retreatment of the plate after use may also be desirable to restore the hydrophilic properties.

As demonstrated in the working examples, the preparation of lithographic plates by the claimed photografting and amplification process offers several advantages. First, the process is a way of making positive working lithographic plates. Second, expensive and toxic organic solvents are not required in the developing step. Third, the quality of the plate can be renewed after use or storage.

The following examples are presented for purposes of illustration, parts and percentages being by weight unless otherwise specified.

EXAMPLE 1

This example illustrates photografting an alkyl mercaptosilane to a crosslinked unsaturated polyester resin substrate and then amplifying with a silicate.

A 5 mil grained aluminum lithographic plate is coated, using a Meyer rod with 6 mil wire, with an anhydrous Cellosolve acetate solution containing 57.5 parts of the Cellosolve acetate, 30 parts of a polyester resin, prepared from fumaric acid and the diol made by condensing propylene oxide with Bisphenol A, and having a molecular weight of approximately 3000, 11.5 parts of a trifunctional isocyanate crosslinking agent, the reaction product of 3 moles of hexamethylene diisocyanate and 1 mole of water, named as the biuret of hexamethylene diisocyanate, and composed principally of a compound believed to have the structure:

$$OCN-(CH_2)_6-N-[\overset{O}{\overset{\|}{C}}-NH(CH_2)_6-NHCO]_2$$

and 1 part of zinc acetate. The thus coated plate was cured in an air circulating oven for 1 hour at a temperature of 120°C.

A 0.1 molar methanol solution of gamma-mercaptopropyl trimethoxysilane having the formula

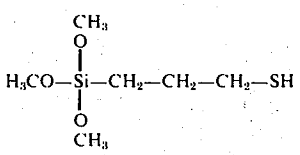

and containing 10% by weight of phloxine dye (based on the mercaptosilane weight) was prepared. This solution was brushed onto the crosslinked polyester substrate at a concentration of approximately 0.1 cc. per 10 $cm^2$, to give a final surface concentration of the mercaptosilane of $10^{-6}$ moles per $cm^2$ after evaporation of the methanol solvent.

The resulting plate was covered with a transparency held in place by a glass plate and exposed to a 650 watt visible movielight type lamp held at a distance of 20 inches for 3 minutes. During exposure a blower was used to cool the surface of the plate. After exposure, the plate was washed with methanol to remove mercaptosilane from the unexposed areas. Then the plate was soaked for 15 hours in a 26% aqueous potassium silicate solution. After the resulting lithographic plate was washed with water, it was wiped with processing gum and inked with a lithographic developing ink to render the image pattern visible. The thus imaged plate was used in a lithographic press with a conventional lithographic ink and fountain solution. Over 1000 impressions were made with satisfactory results.

EXAMPLE 1*a*

This example illustrates amplification by use of a silicate at lower concentration.

A plate was prepared as in Example 1, except the amplification procedure was modified as follows. The imaged plate was soaked in a 5% solution of potassium silicate for 30 minutes. The plate was run on a lithographic press with satisfactory results.

EXAMPLE 1*b*

This example illustrates the retreatment of a deteriorated lithographic plate with a silicate solution to restore performance.

The process of Example 1 was repeated. The resulting plate was allowed to run on a lithographic press until the hydrophilic areas began to deteriorate by scumming. The press was stopped and ink removed from the plate with solvent. The plate was then rubbed vigorously with a pad saturated with a 13% aqueous solution of potassium silicate. After 5 minutes, the excess silicate solution was wiped off with a water-soaked pad. The press was restarted. The printing was satisfactory, showing that the hydrophilic areas of the plate had been restored.

EXAMPLE 2

This example illustrates photografting an alkyl mercaptosilane to a crosslinked unsaturated polyester resin substrate and then amplifying with a combination of silicate and silica.

The procedure of Example 1 was repeated except that the exposure time was increased to 8 minutes and the soaking in potassium silicate solution was replaced by soaking for 5 hours in a 1:1 mixture of 39% aqueous potassium silicate solution and 30% colloidal sodium ion stabilized silica dispersion (containing 30.0% $SiO_2$ and 0.2% $Al_2O_3$ with a $SiO_2/Na_2O$ weight ratio of 230 dispersed as 13—14 mμ diameter particles in water). The plate was run on a lithographic press for over 3000 impressions with satisfactory results.

EXAMPLE 3

This example illustrates photografting of an alkyl mercapto-silane to a crosslinked polyester resin substrate and then amplifying with an organic colloidal silica.

The procedure of Example 1 was repeated exactly except rose bengal was used as the sensitizing dye, and the soaking in potassium silicate was replaced by soaking for 5 hours in a 15% ammonium ion stabilized silica dispersion (containing 15.0% $SiO_2$ with a $SiO_2/NH_3$ weight ratio of 120 dispersed as 13 to 14 mμ particles in water). The plate was run on a lithographic press for over 3000 impressions with satisfactory results.

EXAMPLES 4–13

These examples illustrate photografting of an alkyl mercapto-silane to a crosslinked polyester resin substrate and then amplifying with a variety of colloidal silicas and silicates.

The procedure of Example 3 was repeated exactly except the colloidal ammonium silicate was replaced by other silicate solutions or silica dispersions.

| Ex. No. | Form | $SiO_2$ Conc. | Counter ion | $SiO_2$/ $M_2O$ wt. ratio | Particle Size |
|---|---|---|---|---|---|
| 4 | colloidal silica | 40.0% | sodium | 93 | 13–14 mμ |
| 5 | colloidal silica | 30.0 | sodium | 300 | 15–16 |
| 6 | colloidal silica | 30.0 | sodium | 50 | 7–8 |
| 7 | colloidal silica | 49.0 | sodium | 230 | 13–14 |
| 8 | colloidal silica surface modified with aluminum | 30.0 | sodium | 230 | 13–14 |
| 9 | silicate solution | 33.2 | sodium | 2.4 | — |
| 10 | silicate solution | 20.8 | potassium | 2.5 | — |
| 11 | silicate solution | 29.5 | potassium | 1.8 | — |
| 12 | silicate solution | 20.0 | lithium | 9.6 | — |
| 13 | silicate solution | 30.0 | tetra-ethanol ammonium | 7.5 | — |

Each plate was run on a lithographic press for over 3000 impressions with satisfactory results.

EXAMPLE 14

This example illustrates photografting of an alkyl mercapto-silane to a crosslinked unsaturated styrene-butadiene copolymer rubber substrate and then amplifying with a silicate. The procedure of Example 2 was repeated except the polyester coated aluminum substrate was replaced by a 5 mil grained aluminum lithographic plate which was coated, using a 12 mil doctor blade, with a 12% solution of a copolymer of styrene and butadiene in toluene, containing 0.5 wt. % (based on the polymer) of dicumyl peroxide. The thin coated plate was cured under nitrogen in an oven at 150°C. for 40 minutes. In addition, the phloxine dye was replaced with rose bengal, and exposure was for 15 minutes. After imaging and silicate amplification, the plate was run on a lithographic press for over 1000 impressions with satisfactory results.

EXAMPLES 15 AND 16

These examples illustrate photografting of an alkyl mercapto-silane to crosslinked unsaturated substrates and then amplifying with a silicate.

The procedure of Example 14 was repeated except the copolymer of styrene and butadiene was replaced with (Example 15) natural rubber, and (Example 16) a terpolymer of 65 mole percent ethylene, 30 mole percent propylene, and 5 mole percent dicyclopentadiene. In each case the plate was run on a lithographic press for over 1000 impressions with satisfactory results.

EXAMPLES 17–28

These examples illustrate photografting of a variety of mercapto-silanes to a crosslinked unsaturated polyester substrate and then amplifying with a silicate.

The procedure of Example 1 was repeated exactly except the gamma-mercaptopropyl trimethoxysilane was replaced by other mercapto-silanes:

Example 17 $HS—(CH_2)_3—Si(OC_2H_5)_3$ γ-mercaptopropyl triethoxysilane

Example 18 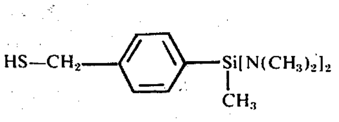 α-mercaptotolyl bis-(dimethylaminomethyl-silane)

Example 19 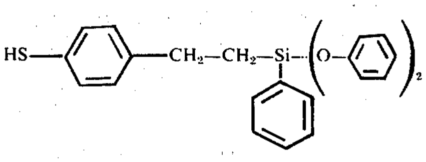 (p-mercaptophenyl ethyl) diphenoxyphenyl-silane

Example 20 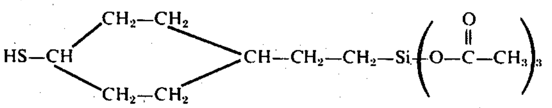 β-(4-mercaptocyclohexyl) ethyltriacetoxysilane

Example 21 $HS—(CH_2)_2O(CH_2)_2—Si(OCH_2CH_3)_3$ β-mercaptoethoxyethyl-triethoxysilane Example 22 $HS—CH_2—CH(Cl)—(CH_2)_2—Si(OCH(CH_3)_2)_3$ 4-mercapto-3-chloro-butyltriisopropoxy-silane Example 23 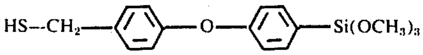 4-mercaptomethyl-4'-trimethoxysilane diphenyl ether Example 24 $HS—CH_2—CH_2—CH(Cl)—CH_2—Si(CH_3)_2(OCH_3)$ 4-mercapto-2-chloro-butyldimethylmethoxy-silane Example 25 $[HS—(CH_2)_3]_2Si(OCH_3)_2$ bis(γ-mercaptopropyl) dimethoxysilane Example 26 $[HS—(CH_2)_3]_3SiOCH_3$ tris(γ-mercaptopropyl)methoxy-silane Example 27 $HS—(CH_2)_3—Si(N(H)—C(=O)—CH_3)_3$ tris(acetamido)-γ-mercapto-propylsilane Example 28 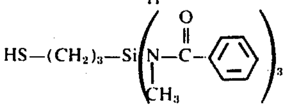 tris(N-methylbenzamido)-γ-mercaptopropylsilane In each example the plate was run on a lithographic press for over 1000 impressions with satisfactory results.

EXAMPLE 29

This example illustrates the use of an ultraviolet sensitizer and imaging using ultraviolet light.

The procedure of Example 1 was repeated except phloxine was replaced with Michler's ketone and the plate was imaged by exposure to a mercury short arc lamp for two minutes. After silicate treatment, the plate was run on a lithographic press for over 1000 impressions with satisfactory results.

EXAMPLE 30

This example illustrates the use of an ultraviolet sensitizer and imaging using ultraviolet light.

The procedure of Example 1 was repeated except phloxine was replaced with thioxanthone, and the plate was imaged by exposure to a mercury short arc lamp for 2 minutes. After silicate treatment, the plate was run on a lithographic press for over 1000 impressions with satisfactory results.

EXAMPLES 31–33

These examples illustrate preparation of lithographic plates by photografting an alkyl mercapto-silane to uncrosslinked thermoplastic polymers and then amplifying with a silicate.

Five mil grained aluminum lithographic plates were laminated to 5 mil sheets of the following unsaturated polymers by molding the polymers to the sheets in a compression press: (Example 31) trans-1,4-butadiene with a molecular weight of about 250,000; (Example 32) an allyl ether modified ethylcellulose with a molecular weight of about 200,000 with an average degree of substitution of 2.5 ethoxy substituents and 0.2 allyl ether substituents per anhydroglucose unit; (Example 33) a crystalline epichlorohydrin - allyl glycidyl ether copolymer containing a molar ratio of 90:10 epichlorohydrin to allyl glycidyl ether monomer units and with a molecular weight of about 200,000.

These plates were coated with gamma-mercaptopropyltrimethoxysilane solution containing phloxine dye, exposed through a transparency, washed with methanol, soaked in 5% potassium silicate solution, and run on a lithographic press according to the procedure of Example 1(*a*). The plates were run on the press for over 1000 impressions with satisfactory results.

What we claim and desire to protect by Letters Patent is:

1. A process for preparing a lithographic printing plate which comprises the following steps:

a. photografting imagewise to an unsaturated oleophilic organic polymer substrate a hydrolyzable mercapto-silane compound having the general formula $$\begin{array}{c} (T)_b \\ | \\ (X)_a\text{—Si—}(R\text{—}SH)_c \end{array}$$

where R is an organic radical, X is selected from mono and dialkyl amino, alkyl and aryl amido, alkoxy, aryloxy and alkyl and aryl oxycarbonyl radicals; T is selected from alkyl, cycloalkyl, aryl, alkaryl, aralkyl radicals and the corresponding halogenated radicals; $a$ is an integer from 1 to 3; $b$ is an integer from 0 to 2; $c$ is an integer from 1 to 3; and $a+b+c$ equals 4;

b. washing away non-photografted mercapto-silane compound from unexposed areas; and c. amplifying the hydrophilicity of the hydrolyzed silane groups by treating with at least one amplifying agent selected from soluble silicate solutions and colloidal silica dispersions.

2. The process of claim 1 wherein the oleophilic organic polymer substrate is a crosslinked polyester resin.

3. The process of claim 1 wherein the amplifying agent is a silicate.

4. The process of claim 1 wherein the amplifying agent is colloidal silica.

5. The process of claim 1 wherein the amplifying agent is a mixture of silicate and colloidal silica.

6. A lithographic printing plate prepared by the process of claim 1.

7. In a process of preparing a lithographic printing plate which comprises photografting imagewise to an unsaturated oleophilic organic polymer substrate a hydrolyzable mercapto-silane compound and washing away non-photografted mercapto-silane compound from unexposed areas, the improvement of amplifying the hydrophilicity of the silane groups on the photografted hydrolyzed mercapto-silane compounds by treating with at least one amplifying agent selected from soluble silicate solutions and colloidal silica dispersions.

* * * * *